United States Patent
Pitwon (10) Patent No.: US 7,454,097 B2
(45) Date of Patent: Nov. 18, 2008

(54) OPTICAL CIRCUIT BOARD, AN OPTICAL BACKPLANE AND AN OPTICAL COMMUNICATION SYSTEM

(75) Inventor: Richard Charles Alexander Pitwon, Fareham (GB)

(73) Assignee: Xyratex Technology Limited, Hampshire (GB)

( * ) Notice: Subject to any disclaimer, the term of this patent is extended or adjusted under 35 U.S.C. 154(b) by 0 days.

(21) Appl. No.: 11/691,772

(22) Filed: Mar. 27, 2007

(65) Prior Publication Data
US 2008/0013880 A1    Jan. 17, 2008

Related U.S. Application Data

(60) Provisional application No. 60/787,685, filed on Mar. 31, 2006.

(51) Int. Cl.
*G02B 6/00* (2006.01)
(52) U.S. Cl. .......................... 385/14; 398/164
(58) Field of Classification Search ............... None
See application file for complete search history.

(56) References Cited

U.S. PATENT DOCUMENTS

| | | | | |
|---|---|---|---|---|
| 5,204,925 A * | 4/1993 | Bonanni et al. | ............... | 385/89 |
| 5,220,628 A * | 6/1993 | Delbare et al. | ............... | 385/14 |
| 5,937,133 A * | 8/1999 | Moss et al. | ................ | 385/137 |
| 6,005,991 A * | 12/1999 | Knasel | .......................... | 385/14 |
| 6,229,942 B1 * | 5/2001 | Engberg et al. | ............... | 385/39 |
| 6,937,808 B2 * | 8/2005 | Kawase et al. | .............. | 385/137 |
| 7,213,974 B2 | 5/2007 | Kiani | | |
| 2005/0201707 A1 * | 9/2005 | Glebov et al. | ............... | 385/132 |
| 2006/0067608 A1 * | 3/2006 | Kobayashi et al. | ............ | 385/14 |
| 2007/0286555 A1 | 12/2007 | Kiani | | |

FOREIGN PATENT DOCUMENTS

WO    WO 2006/129069 A1    12/2006
WO    WO 2007/010184 A1    1/2007

* cited by examiner

*Primary Examiner*—Sung Pak
*Assistant Examiner*—Mike Stahl
(74) *Attorney, Agent, or Firm*—Pillsbury Winthrop Shaw Pittman LLP (57) ABSTRACT

The invention provides an optical circuit board, the circuit board comprising: a rigid support layer; a flexible support layer formed on the rigid support layer; and, an optical layer formed on the flexible support layer. The optical layer includes one or more optical waveguides extending from a first area of the optical circuit board to an edge of the circuit board wherein the flexible support layer extends beyond the edges of the rigid support layer thereby defining a flexible passive optical connector for the circuit board.

14 Claims, 5 Drawing Sheets

OPTICAL CIRCUIT BOARD, AN OPTICAL BACKPLANE AND AN OPTICAL COMMUNICATION SYSTEM

The present application claims priority from U.S. Provisional patent application No. 60/787,685 filed on 31 Mar. 2006, the entire contents of which are hereby incorporated by reference.

The present invention relates to an optical circuit board, an optical backplane and to an optical communication system. In particular embodiments, the invention relates to an optical printed circuit board (PCB) and to a communication system incorporating such an optical circuit board or PCB.

In our co-pending patent application filed on 1 Jun. 2005, having serial number U.S. Ser. No. 60/686,053, now published as WO-A-06/129,069 there is disclosed an optical connector and an optical PCB. The entire content of WO-A-06/129,069 is hereby incorporated by reference. A system disclosed in WO-A-06/129,069 requires an optical connector arranged, in use, to be connected to an optical PCB. The connector is arranged to receive electrical signals from the PCB and includes an electro-optical transceiver for receiving the electrical signals and converting the electrical signals into optical signals for onward transmission to another circuit board to which the printed circuit board in question is connected in use.

A number of electrically conductive paths are provided on the PCB for coupling electrical signals to and from the electro-optical transceiver and electrical components provided on the PCB. In other words, the connector includes an active electro-optical transceiver for generating optical signals for onward transmission from the PCB to a second optical PCB (such as an optical backplane) to which the optical PCB in question is connected and also for receiving optical signals from the optical backplane and converting the received optical signals into electrical signals for coupling to electrical components arranged on the optical PCB in question.

The system described in WO-A-06/129,069 functions well. However, there is need for an optical circuit board that is capable of functioning at high data rates without adversely effecting operation of the circuit board. As data rates increase, the optical transceiver arranged on the connector of the optical PCB disclosed in WO-A-06/129,069 may reach the limit of its performance.

If there are a number of electrical connections from different components on a circuit board, each connected to an optical transceiver on a connector connected to the circuit board, then a "bottle neck" may develop as the optical transceiver may simultaneously have to receive and process electrical and optical signals from numerous sources. Again, as data rates increase, the optical transceiver may be pushed to the limit of its effective operation.

When plural electrical paths all attempt to couple signals to a localised connector for connection into optical signals, cross-talk may occur between the various electrical paths. This is clearly undesirable as data can be lost and signal quality degraded. Again, as data rates increase this problem will become more noticeable.

According to a first aspect of the present invention, there is provided an optical circuit board, the circuit board comprising: a rigid support layer; a flexible support layer formed on the rigid support layer; and, an optical layer formed on the flexible support layer, the optical layer including one or more optical waveguides extending from a first area of the optical circuit board to an edge of the circuit board wherein the flexible support layer extends beyond the edges of the rigid support layer thereby defining a flexible passive optical connector.

The invention provides an optical circuit board in which a flexible connector including a passive optical connector is included. Thus, the connector, being passive, merely receives optical signals and ensures the reliable onward transmission of the optical signals, without necessarily performing any processing of the signals. Thus, no bottle necks of localised electronic signal paths are formed. Furthermore, by providing a passive optical connector on the circuit board, the active optical components can be located at other suitable locations. Thus, simplified design of optical circuit boards is facilitated. The invention therefore enables a reliable pluggable passive optical connection to be sustained between a first circuit board, such as a daughtercard and a second circuit board, such as an optical backplane.

The passive optical connector is effectively defined by the waveguide(s) supported on the flexible support layer. Since the flexible support layer (and preferably the waveguides formed thereon) extends beyond the edges of the rigid support layer, the region of the flexible support layer not supported by rigid support layer can effectively move relative to the rigid support layer, thus making the passive optical connector movable with respect to the circuit board. This is important as it enables simple and accurate registration of the passive optical connector with a suitably formed port or connector on another optical circuit board such as an optical backplane.

Furthermore, since in some preferred embodiments the passive optical connector may be defined by the same optical layer that defines the one or more optical waveguides on the optical circuit board, no complex means of communication is required between the one or more waveguides and the optical connector. The manufacture and operation of the device is thus simplified.

Preferably, the flexible connector includes one or more optical waveguides formed of the same material from which the one or more waveguides on the circuit board are formed. This is particularly simple to achieve as the connector is formed merely by the absence of the rigid support layer at regions towards the edge of the circuit board. Therefore a single optical layer is required for forming the optical waveguides both on the main body of the circuit board and also on the connector at the edge of the circuit board.

The connector is moveable with respect to the main body of the circuit board as it is not constrained by being in direct contact with the underlying rigid support layer. Thus by enabling relative movement between the passive optical connector and the main body of the circuit boards it is possible to enable a simple and reliable method for connection of the optical circuit board to another optical circuit board such as an optical backplane. It will be appreciated that any number of optical connectors can be defined at the edge of the circuit board, in one example the number being defined by the relative sizes and shapes of the rigid support layer and the overlying flexible support and optical layers from which the waveguides are formed. The shape of each connector may be selected/determined by the shape of the flexible support and optical layers in the edge regions of the circuit board. In the particular non-limiting example shown in FIG. 1 below, each connector is rectangular.

A limited degree of fixing of the connector is preferably provided by one or more support structures such as struts connected to the main body of the circuit board.

According to a second aspect of the present invention, there is provided an optical communication system, comprising: an optical backplane, having two or more sockets each for receiving a pluggable optical circuit board, e.g. daughtercards, and two or more pluggable optical circuit boards plugged into the backplane such that optical communication between any two of the two or more pluggable optical circuit boards is enabled through the optical backplane, wherein at least one of the optical circuit boards is a pluggable optical circuit board according to the first aspect of the present invention.

Preferably, a flexible connector is provided within each socket on the optical backplane.

Thus, in embodiments, the invention provides a solution to the problem of requiring quasi free-floating optical interfaces on both an optical circuit board such as a daughtercard and a backplane, thus enabling the simple formation of an optical communication system. In embodiments, the invention takes into account that electronic traces carrying high speed signals on a daughtercard should not be routed to a dedicated optical transceiver location on the edge of the card at the location of the connection with the optical backplane to which, in use, the daughtercard is connected. Although such an arrangement is tolerable at present data rates, e.g. 10 G, when data-rates increase this will become inconvenient and could have seriously negative effect on the operation of the daughtercard and signal quality.

Furthermore, the problem of movement between pluggable optical circuit boards, i.e. daughtercards, and the backplane, which will occur in any real system as a result of vibrations, air flow variations and thermal and mechanical PCB deformation is accommodated by the flexibility in the connections between the two.

According to a third aspect of the present invention, there is provided an optical communications system comprising an electro-optical backplane and one or more daughtercards connectable thereto, wherein on one of or both the or each of the daughtercards and the optical backplane exposed flexible optical waveguide regions and interface structures are provided to thereby support a high-precision pluggable optical connection between the backplane and the or each daughtercard.

According to a fourth aspect of the present invention, there is provided an optical backplane, comprising: a rigid support layer; a flexible support layer formed on the rigid support layer; an optical layer formed on the flexible support layer, the optical layer including one or more optical waveguides; and, one or more opening defined within the rigid support layer forming sockets for receiving a pluggable optical circuit board, wherein the flexible support layer extends partly into the or each of the sockets to thereby define a flexible passive optical connector within the or each socket.

According to a fifth aspect of the present invention, there is provided a method of making an optical circuit board, the method comprising:

providing a rigid support layer;

providing one or more electrical layers thereon and forming electrical connections therefrom having desired shapes/patterns etc;

providing a flexible support layer on the resultant structure;

forming one or more optical waveguides on the flexible support layer; and selectively removing the rigid support layer from one or more edge regions of the circuit board. Thus, one or more flexible passive connectors are defined, formed from the flexible support layer and the optical waveguide(s).

Examples of the present invention will now be described in detail with reference to the accompanying drawings, in which.

Figure 1:
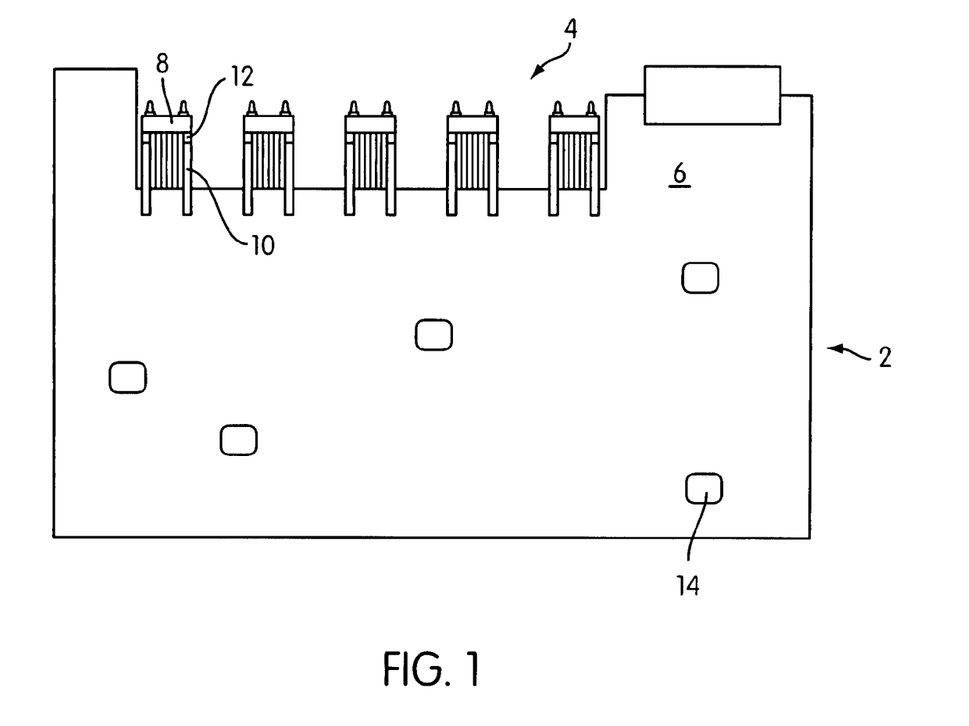
FIG. 1 is a schematic representation of an optical circuit board according to an example of an embodiment of the present invention.

FIG. 1 shows an optical circuit board 2 comprising plural flexible connectors 4 arranged at an edge region 6 of the circuit board 2. Each of the connectors 4 comprises a passive optical connector 8 for optically connecting the circuit board 2 with a second optical circuit board, such as an optical backplane.

The optical connectors 4 are each flexibly mounted with respect to the main body of the optical circuit board 2. Thus, a degree of movement of the passive optical connectors 8 is enabled relative to the main body of the circuit board 2. By enabling relative movement between the passive optical connectors 8 and the circuit board 2, it is possible to enable a simple and reliable method for connection of the optical circuit board 2 to another optical circuit board such as an optical backplane. The degree of movement of which the connectors 4 are capable is controlled by the presence of struts 10 and springs 12 as will be explained in greater detail below.

In the specific example shown in FIG. 1, transceivers 14 are provided on the circuit board for receiving optical transceivers. The optical transceivers are arranged for coupling optical signals along optical paths (not shown) to the optical connectors 4. Thus, there is no "bottle necking" of signals at the connectors 4 as by the time the signals reach the connectors they are already optical signals. There is no requirement for converting electrical signals into optical signals at the connectors 4. This is achieved at a defined distance from the connectors at the transceivers 14 on the circuit board 2. Thus, the problem of cross-talk identified above, is substantially addressed. The location of the optical transceivers 14 can be selected so as to ensure that minimal cross-talk occurs between electrical paths (not shown) on the circuit board 2.

Figure 2:
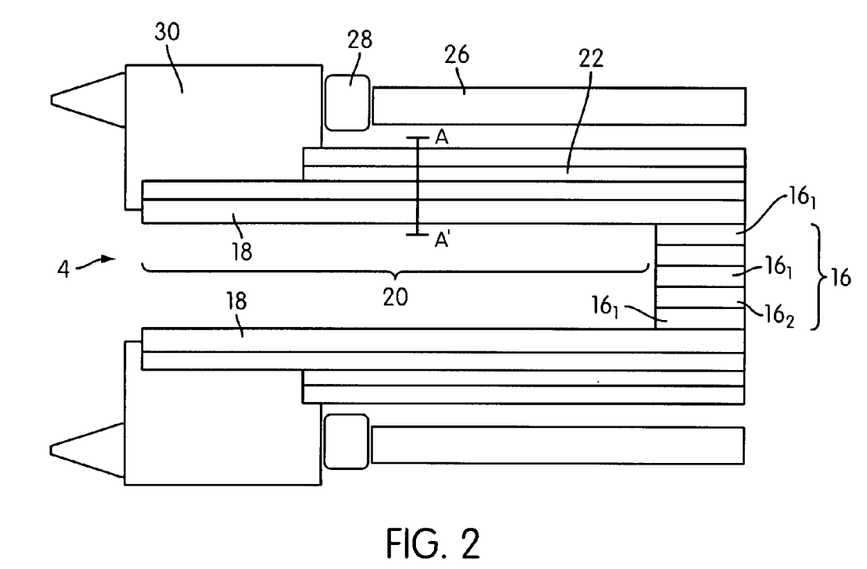
FIG. 2 is a cross-section through a connector for use in connecting the circuit board of FIG. 1 to a second circuit board.

FIG. 2 shows a section through a connector 4. In the specific, non-limiting example of FIG. 2, the connector comprises two parallel connectors, one arranged on each side of the circuit board. Clearly, this is merely a preferred feature of the system disclosed.

In FIG. 2, the circuit board is formed on a base layer which may be a conventional rigid PCB material such as FR4 or a composite structure of FR4 layers and conductor layers e.g. copper layers. In fact, any suitable rigid support material can be used so long as it is suitable for forming a PCB. This is shown as component 16 in FIG. 2. In the particular example shown the rigid support layer is formed of a composite structure of copper layers $16_1$ and FR4 layers $16_2$. Provided on the top layer of the FR4 layer 16, there is provided a flexible PCB material, such as Kapton Polyimide. The flexible layer 18 extends further than the rigid layer 16 such that there is a region 20 of exposed flexible material.

During manufacture, one or more optical waveguides 22 are preferably formed extending along the flexible layer 18 within the region 20. The waveguides 22 thus enables optical signals to be coupled from some location within a remote region of the circuit board 16 to the connector 4. The structure of the waveguides 22 will be described in greater detail below. To provide some degree of mechanical support to the connector 4, a rigid strut 26 is provided that connects at one end via a spring buffer 28 to a connector block 30 (to be described in detail below) and at its other end (not shown) to some anchor on the circuit board 2.

In the example shown in FIG. 2 a first connector is provided on the top shown surface of the circuit board 2 and a second connector is shown on the opposite bottom shown surface of the circuit board 2. This arrangement is a preferred embodiment and it typically will be the case that only a single connector will be provided on the circuit board 2.

Figure 3:
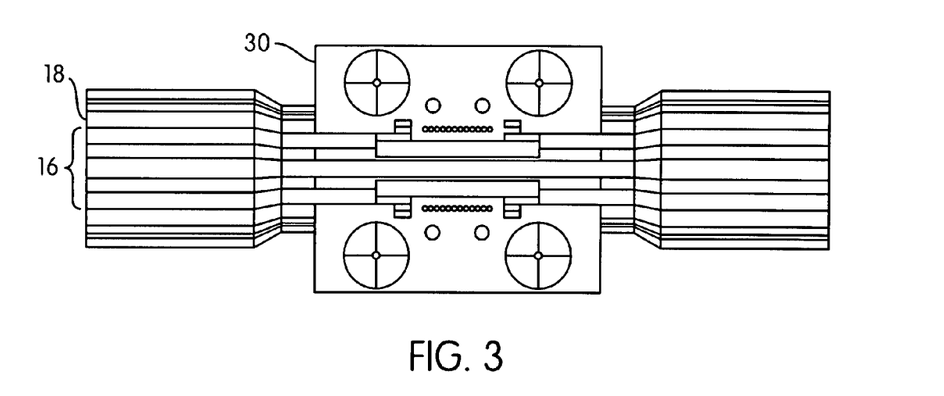
FIG. 3 is an optical interface section front view of the arrangement of FIG. 2.

FIG. 3 shows a front view of the connectors 4 of FIG. 2. The arrangement of components within the connector block 30 is clearly shown and will be described in greater detail below with reference to FIG. 5.

Figure 4:
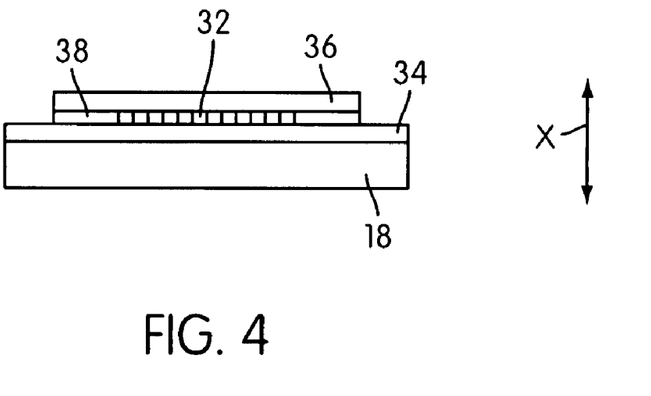
FIG. 4 is a schematic representation of a section through the line A A' in FIG. 2.

FIG. 4 shows a section along the line AA' in FIG. 2. The section is of the waveguides formed on the circuit board 2. Referring to FIG. 4, the flexible connector comprises a polyimide flexible layer 18 that extends beyond the outer boundary of the rigid PCB support material 16 (see FIG. 2). A plurality of optical waveguide structures 32 are formed, between two optical polymer cladding layers 34 and 36. An optical polymer core layer 38 is also provided to define, in combination with the upper and lower optical polymer cladding layers 34 and 36, the waveguides 32.

Thus, by adopting this structure for optical waveguides, a degree of flexibility is provided to the end faces, i.e. the input/output interfaces, of the waveguide structures 32. In other words, the waveguide structures are free to move in the direction X shown in FIG. 4. Therefore, when the connector 4 is to be connected to a corresponding connector on a second optical circuit board, the ability of the connector block 30 to move relative to the circuit board rigid substrate 16 ensures that an accurate alignment between the optical interface of the connector 4 and a corresponding optical interface on the second optical circuit board, can easily be achieved. By providing the structure of the connector as part of the flexible optical layer from which the remainder of the circuit board is also formed a simple and reliable method of forming the circuit board and connector is enabled.

Figure 5:
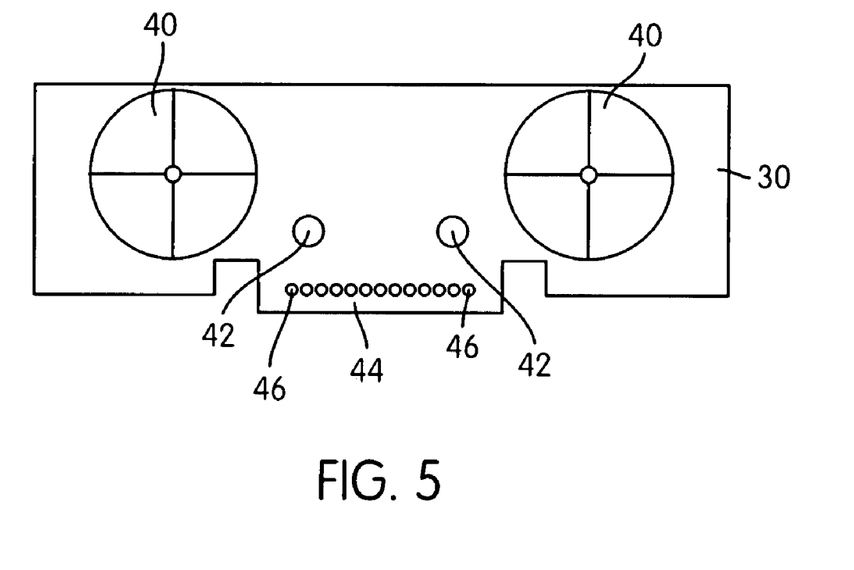
FIG. 5 is a front view of the waveguide alignment head used in FIG. 3.

Referring to FIG. 5, an end view of the connector block 30 is shown. The connector block is an example of component for arrangement at the distal end of the connector for enabling simple and reliable connection of the circuit board to a second circuit board, such as an optical backplane. In the example shown in FIG. 5, the connector block 30 comprises primary 40 and secondary 42 components for aligning the connector block with a corresponding connector on a second circuit board.

In the non-limiting example shown in FIG. 5, the primary components are in the form of alignment stubs or projections for engagement with corresponding recesses or slots within a connector on a second circuit board. The shape of the primary components are selected to be suitable for providing rough approximate alignment of the connector block with the connector on the second circuit board. To this end, the primary components 40 are relatively large with reference to the overall size of the connector block 30 and they are shaped such that their diameter decreases with distance from the block 30. Preferably, a chamfered, conical or frusto-conical form is used.

The secondary components 42 are significantly smaller, e.g. an order of magnitude smaller, and engage only once the primary components have ensured that the connector block 32 is substantially aligned with the corresponding connector on the second circuit board.

Of note is that the connector block also includes a passive optical interface 44 through which light signals can be coupled into and out of the connector block 32. Components such as graded index lenses may be suitable for such an optical interface.

Of course, it is important that the connector block 32 is accurately aligned with the distal end of the waveguides leading off the circuit board. To achieve this the connector block 32 may be formed with registration features 46 to engage with corresponding features on the circuit board. This may be achieved using the method of manufacturing described in detail in our co-pending patent application number WO-A-2007/010184, the entire contents of which are hereby incorporated by reference. What the method requires is that the corresponding features on the circuit board are formed during the same step as forming the waveguides, e.g. using the same exposure mask used for forming the waveguides themselves. Thus, the exact relative positioning of the corresponding features on the circuit board can be known relative to the waveguides which enables a standard connector block 32 to be used and ensures alignment between the input/output interfaces of the waveguides and those (not shown) of the connector block.

The connector block 32 comprises an optical interface 44 that in use may be aligned with the waveguide or waveguides of a second optical circuit board such as an optical backplane to enable optical communication between the circuit board and the optical backplane. Alternatively the optical interface 44 may be aligned with the optical interface of a corresponding connector block on the secure optical circuit board. It is important to note that in a multiple waveguide arrangement, simultaneous alignment of the parallel optics within the connector block 32 may be desired with all the waveguides on the second optical circuit board. The optical interface is a passive interface for transmitting and receiving light signals.

As will be explained below, the optical interface includes one or more lenses to image or collimate light passing through it. By providing an imaging lens or lenses, optical coupling to a small waveguide is improved as all light is imaged into a small image point.

Figure 6:
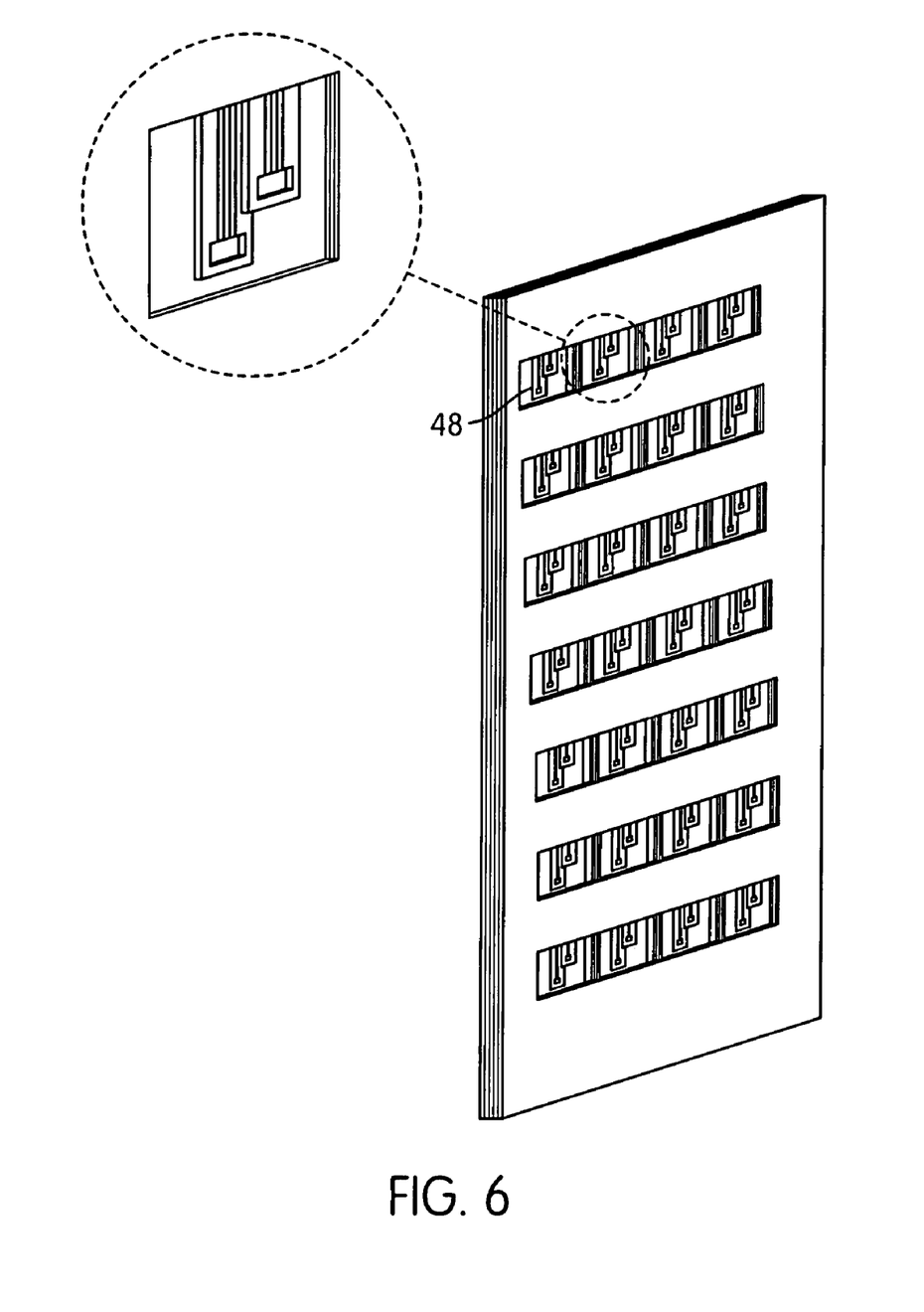
FIG. 6 is a schematic representation of an electro-optical backplane.
Figure 7:
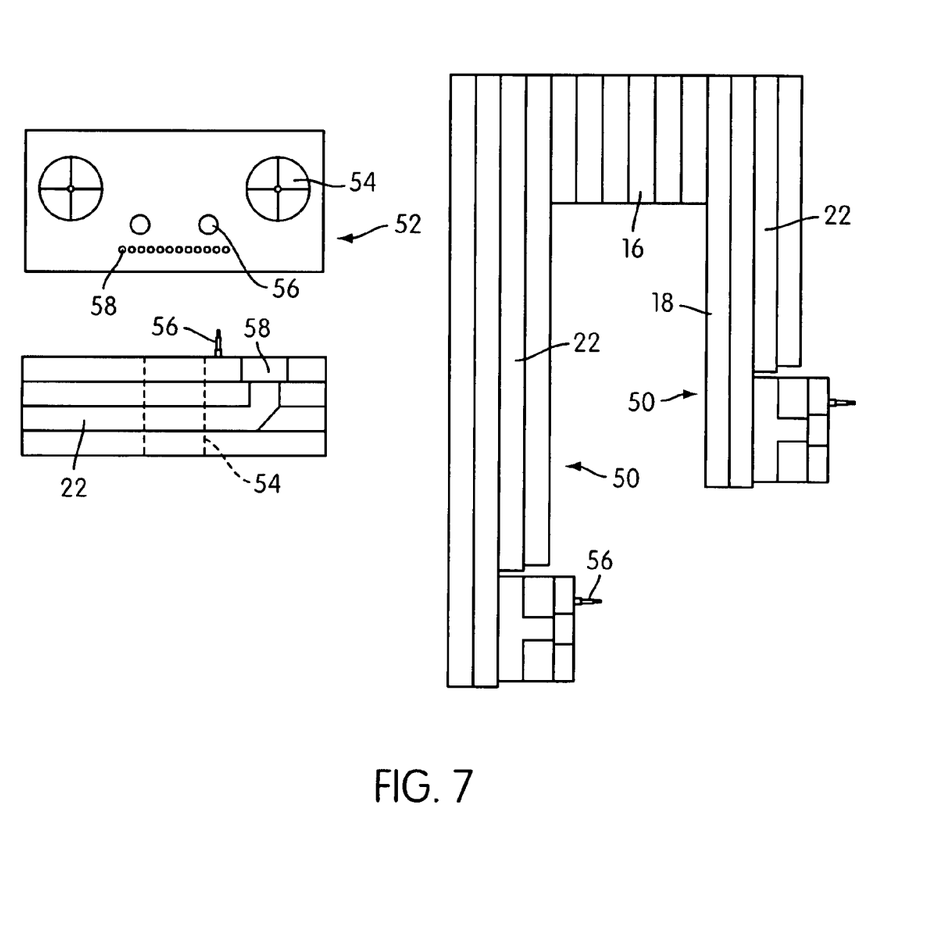
FIG. 7 is a side view of the connectors used in the backplane of FIG. 6.

FIGS. 6 and 7 show an example of a second optical circuit board (in this particular case the second optical circuit board is an optical backplane) to which the circuit board of FIGS. 1 to 5 may, in use, be connected. When one or more optical circuits boards such as that shown in FIG. 1 is or are connected to a circuit board such as that shown in FIG. 6, an optical communications system is established in that optical communication is enabled between two or more connected optical circuit boards. Two circuit boards connected to the backplane of FIG. 6 may be said to be connected, just as the backplane can be said to be connected to each of the two circuit boards directly plugged in to it.

The backplane is a passive electro-optical backplane composed of a standard rigid support layer such as FR4 and copper layers as well as one or more layers of optical polymer printed on a flexible support layer such as a polyimide flex. The printed optical polymer define one or more waveguides for the transmission of optical signals along the backplane. Slots or openings 48 are provided in the rigid support layer defining regions where the flexible support layer and the optical layers are exposed, thus defining flexible passive optical connectors 50 similar to the connector 30 of the circuit board shown in FIG. 1. Passive optical devices (connector blocks) 52 are provided to engage with a connector block 32 on a second optical circuit board such as one of the type shown in FIG. 1. Although not shown, the passive optical connectors 50 are supported by buffered struts in the same manner as the struts 26 and buffers 28 support the connector shown in FIG. 2.

It will be appreciated that in the example shown it is envisaged that flexible passive connectors, as described above, will be provided both on the backplane and on the daughtercards. In one embodiment however, the flexible connectors are provided either only on the backplane or only on the daughtercards. On the other circuit board (i.e. daughtercards or backplane, respectively), conventional rigid connectors may be provided for engagement with the flexible connector of the backplane or daughtercard(s).

FIG. 7 shows the structure of an example of a connector block 52. The connector block 52 is configured to be suitable for engagement with a connector block 32 of the type shown in and described with reference to FIGS. 2, 3 and 5. The connector block 52 comprises primary 54 and secondary 56 components for aligning the connector on the backplane with a corresponding connector on a second circuit board, e.g. a daughtercard for connection to the backplane. An optical interface 58 is provided for enabling the coupling of optical signals from the waveguides on the daughtercard to the waveguides on the optical backplane. In the example shown the optical interface 58 is formed by an array of GRIN lenses.

The primary components 54 are coarse alignment slots for receiving the alignment stubs or projections of the connector block 32 of a daughtercard. The coarse alignment slots are suitably sized to receive the alignment stubs or projections of the connector block 32 of a daughtercard. The secondary components 56 are a pair of precision alignment pins which only engage once the primary components have received the alignment stubs or projections of the connector block 32 of a daughtercard. Thus, in combination with the constructions of the connector block 32 on the daughtercard, the connector block 52 of the backplane serves to provide a simple and reliable way by which accurate alignment of the daughtercard optical interface can simply be achieved with the optical interface 58 of the backplane.

The openings or slots 48 are sized to receive the connector 4. A cam and spring latch mechanism (not shown) in combination with the flexible PCB substrate may be used, both to lock the connector in place and to manipulate the position of the photonic interfaces of the backplane and the daughtercard. Thus, the connector ensures that the interface is in suitable alignment with the optical backplane and the waveguide or waveguides thereon. In combination with the geometry of the connector, this enables controlled engagement and disengagement of the photonic interface with the waveguide on the optical backplane. It is preferred that no such CAM and spring mechanism be provided so that engagement of a daughtercard with the backplane may be achieved with a simple plugging action. The configuration shown in FIGS. 1 to 7 enable such an interaction to be achieved.

In the particular example shown in the Figures, the connector blocks 30 and 52 comprise a pair of pins and sockets such as standard MT pins that are sized to engage with each other. Other suitable alignment devices may be used. It is preferred that the pins 56 are shaped to make easier their entry into the slots 42. For example the pins may be chamfered or smoothly tapered at the top, i.e. first point of pin entry. Of course, the pin/socket relationship may be reversed such that sockets are provided on the backplane for engagement with pins on the connector. Indeed, any suitable means of alignment may be utilised.

To manufacture the circuit board of FIG. 1, initially a rigid PCB support layer such as FR4 is provided. Upon the FR4, one or more electrical layers are laid down using conventional lithographic PCB manufacturing techniques, e.g. the use of photoresist, UV exposure, selective etching etc to define required patterns of conductor such as copper on the FR4.

Next a flexible polymer layer is provided such as a polyimide flex layer. Upon this, the required optical layers are laid down and the necessary patterns of waveguides are formed. Once this has been done, the edge region of the FR4 in desired parts of the circuit board are removed, e.g. by etching, thus leaving the flexible polyimide flex with the optical waveguides arranged thereon. Last, the connector blocks are added to the structure. As explained above, when forming the waveguides it is preferable that alignment projections or features are formed simultaneously so that the connector blocks 32 and 52 shown in FIGS. 1 to 7 can be accurately aligned with the waveguides.

It will be appreciated that numerous modifications to and departures from the preferred embodiments described above will occur to those having skill in the art. Thus, it is intended that the present invention covers the modifications and variations of the invention, provided they come within that spirit and scope of the appended claims and their equivalents.

The invention claimed is:

1. An optical circuit board, the circuit board comprising:
a rigid support layer;
a flexible support layer formed on the rigid support layer; and,
an optical layer formed on the flexible support layer, the optical layer including one or more optical waveguides extending from a first area of the optical circuit board to an edge of the circuit board wherein the flexible support layer extends beyond the edges of the rigid support layer, an optical interface being defined at the edge of the circuit board by the optical waveguide; and
a support structure comprising a rigid member and a spring buffer arranged to provide flexible support to the optical interface, thereby defining a flexible passive optical connector for the optical circuit board.

2. An optical circuit board according to claim 1, wherein the one or more waveguides extend from the first area of the optical circuit board to the edge of the flexible support layer such that an optical path is provided by the waveguides from the edge of the flexible support layer to the first area.

3. An optical circuit board according to claim 1, comprising plural optical waveguides providing optical paths between the passive optical connector and a corresponding area on the optical circuit board.

4. An optical circuit board according to claim 1, comprising a connector block coupled to the part of the flexible support layer that extends beyond the edges of the rigid support layer to define the flexible passive optical connector.

5. An optical circuit board according to claim 1, comprising an aligner to enable alignment between an optical interface on the optical circuit board and an optical interface on another optical circuit board to which, in use, the optical circuit board is connected.

6. An optical circuit board according to claim 1, comprising one or more optical transceivers connected to the circuit board for coupling light signals into the or each of the optical waveguides.

7. An optical circuit board according to claim 1, comprising a substantially rigid support upon which the flexible support layer is formed, the substantially rigid support layer being smaller than the flexible layer, whereby a region of the flexible layer not supported by the substantially rigid support layer defines the passive flexible connector.

8. An optical circuit board according to claim 1, comprising plural flexible connectors.

9. An optical circuit board according to claim 1, comprising one or more electrically conductive layers for providing electrical paths between electrical components or electro-optical components.

10. An optical circuit board according to claim 9, wherein the electrically conductive layer is patterned to define electrical paths on the optical circuit board.

11. An optical circuit board according to claim 1, wherein the optical layer comprises a lower cladding layer, an optical core layer formed thereon and an upper cladding layer formed on the optical core layer and exposed regions of the lower cladding layer.

12. An optical circuit board according to claim 1, wherein the optical circuit board is one or more of a user circuit for connection to an optical back plane; or an optical backplane for receiving one or more optical user circuits.

13. An optical communication system, comprising:

an optical backplane, having two or more sockets each for receiving a pluggable optical circuit board, and one or more pluggable optical circuit boards plugged into the backplane such that optical communication between any two of the two or more pluggable optical circuit boards is enabled through the optical backplane, wherein at least one of the one or more optical circuit boards is a pluggable optical circuit board according to claim 1.

14. An optical backplane, comprising:

a rigid support layer;

a flexible support layer formed on the rigid support layer;

an optical layer formed on the flexible support layer, the optical layer including one or more optical waveguides; and, one or more openings defined within the rigid support layer forming sockets for receiving a pluggable optical circuit board, wherein the flexible support layer extends partly into the or each of the sockets and being supported by a support structure comprising a rigid member and a spring buffer to thereby define a flexible passive optical connector within the or each socket.

* * * * *